(12) United States Patent
Hasegawa

(10) Patent No.: US 7,377,788 B2
(45) Date of Patent: May 27, 2008

(54) ELECTRICAL CONNECTING APPARATUS AND CONTACT

(75) Inventor: Yoshiei Hasegawa, Kawasaki (JP)

(73) Assignee: Kabushiki Kaisha Nihon Micronics, Musashino-Shi, Tokyo (JP)

( * ) Notice: Subject to any disclaimer, the term of this patent is extended or adjusted under 35 U.S.C. 154(b) by 0 days.

(21) Appl. No.: 11/485,518

(22) Filed: Jul. 11, 2006

(65) Prior Publication Data

US 2007/0096749 A1 May 3, 2007

(51) Int. Cl.
*H01R 12/00* (2006.01)

(52) U.S. Cl. .................................. 439/66

(58) Field of Classification Search ............ 439/66, 439/862, 68–72, 824, 91
See application file for complete search history.

(56) References Cited

U.S. PATENT DOCUMENTS

| | | | | |
|---|---|---|---|---|
| 5,286,208 | A * | 2/1994 | Matsuoka .................. | 439/72 |
| 6,452,407 | B2 * | 9/2002 | Khoury et al. ............. | 324/754 |
| 6,504,223 | B1 * | 1/2003 | Zhou et al. ................ | 257/503 |
| 6,636,063 | B2 * | 10/2003 | Arnold et al. .............. | 324/762 |
| 6,672,875 | B1 * | 1/2004 | Mathieu et al. ............. | 439/66 |
| 6,713,374 | B2 * | 3/2004 | Eldridge et al. ........... | 438/611 |
| 6,948,941 | B2 * | 9/2005 | Eldridge .................... | 439/66 |
| 6,976,888 | B2 * | 12/2005 | Shirai et al. ............... | 439/862 |
| 7,047,638 | B2 * | 5/2006 | Eldridge et al. ............ | 29/884 |
| 7,156,706 | B2 * | 1/2007 | Brown et al. .............. | 439/862 |
| 7,270,550 | B1 * | 9/2007 | Peng ......................... | 439/66 |
| 2002/0055282 | A1 * | 5/2002 | Eldridge et al. ............ | 439/66 |
| 2003/0124879 | A1 * | 7/2003 | Ng et al. .................... | 439/66 |

FOREIGN PATENT DOCUMENTS

| | | |
|---|---|---|
| JP | 08-100784 | 11/1997 |
| JP | 2001-174724 | 12/2002 |
| JP | 2001-235044 | 2/2003 |
| JP | 2001-244519 | 2/2003 |
| JP | 2001-320790 | 4/2003 |

* cited by examiner

*Primary Examiner*—Alexander Gilman
(74) *Attorney, Agent, or Firm*—Jeffrey J. King

(57) ABSTRACT

An electrical connecting apparatus comprises: a base plate provided with a first and a second mounting portion groups respectively having a plurality of first and second mounting portions arranged so as to be alternately positioned in a first direction; and a first and a second contact groups respectively having a plurality of first and second contacts individually mounted on the first and second mounting portions and in a cantilever state, the first and second contacts being displaced from each other in a second direction intersecting the first direction at the mounting positions on the base plate. This prevents any damage to adjacent mounting portions due to heat at the time of mounting the contacts, so that an arrangement pitch of the contacts can be made small.

8 Claims, 15 Drawing Sheets

Figure No. 1
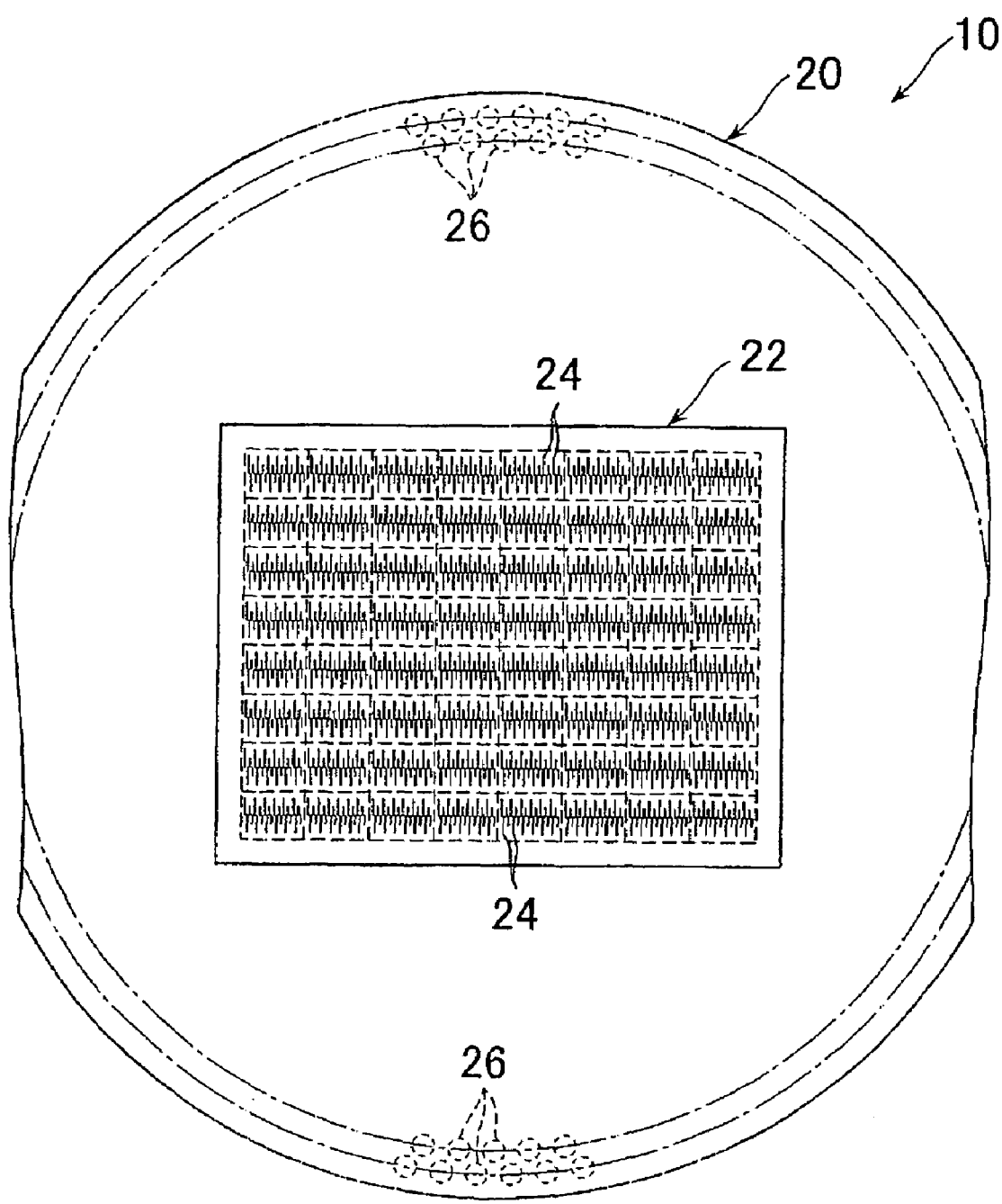

Figure No. 2
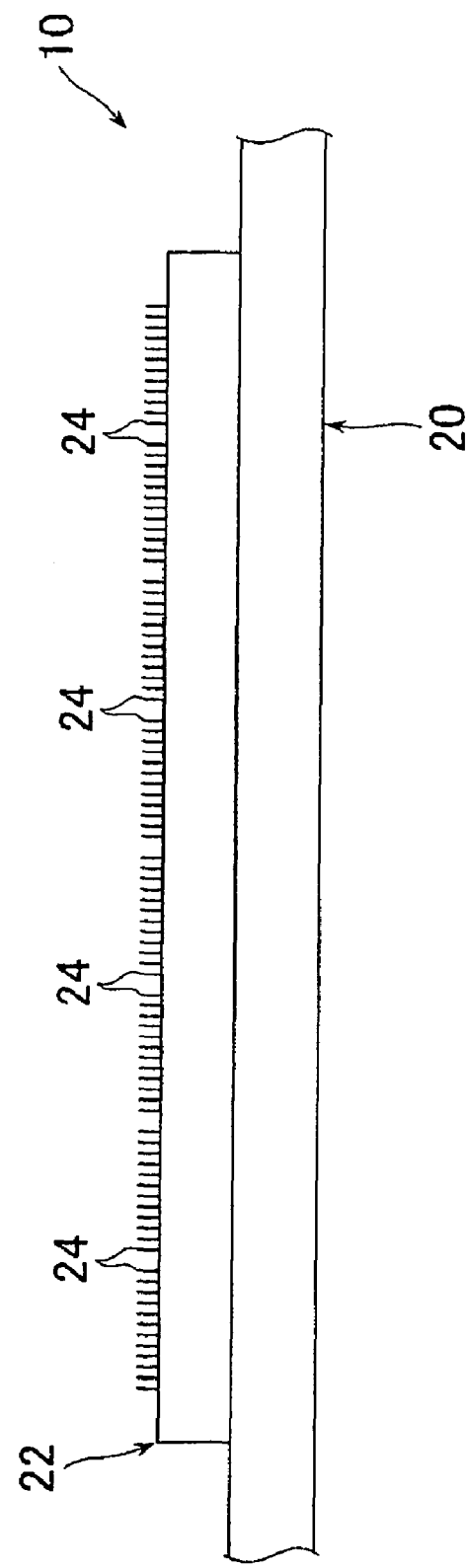

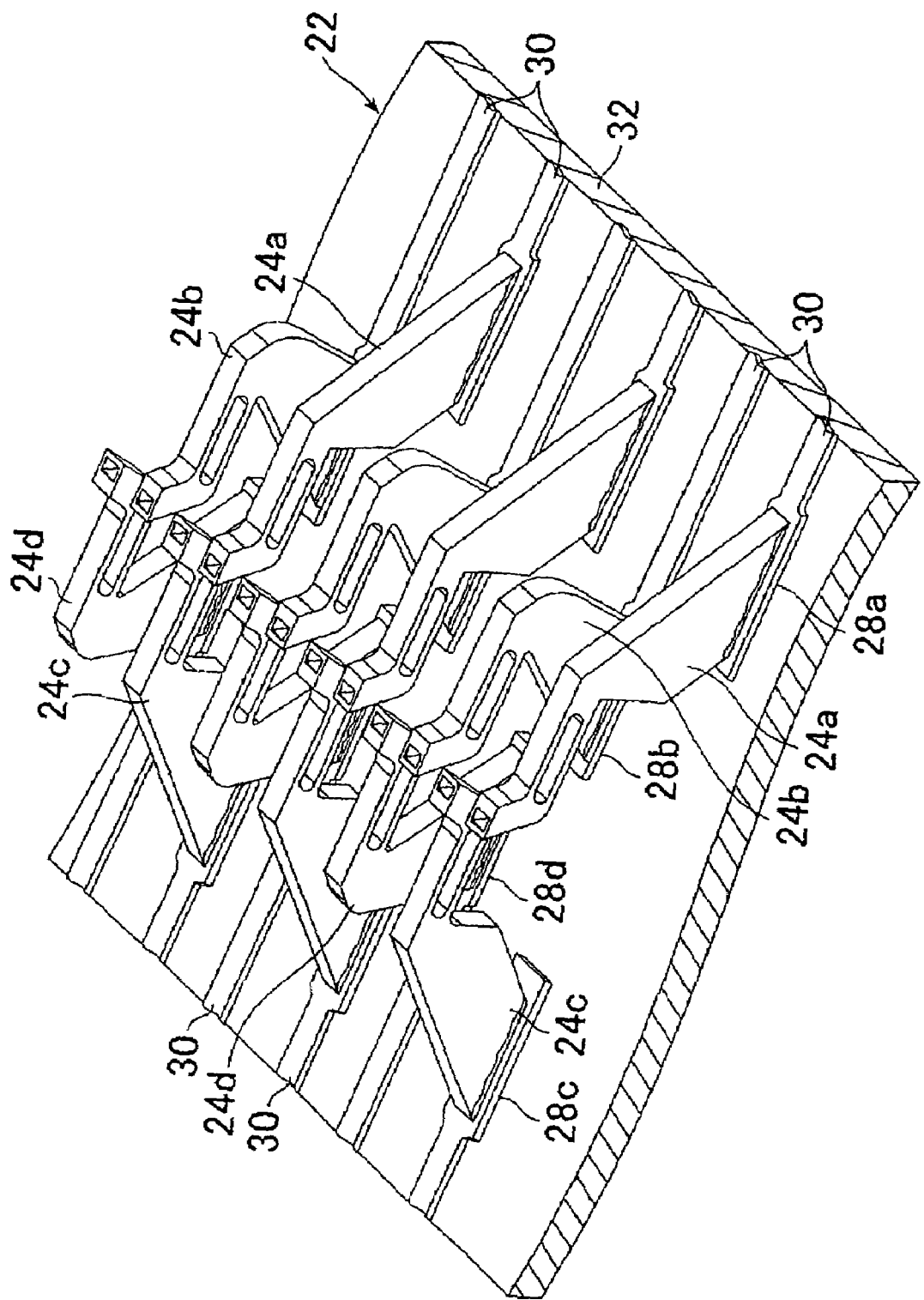
Figure No. 3

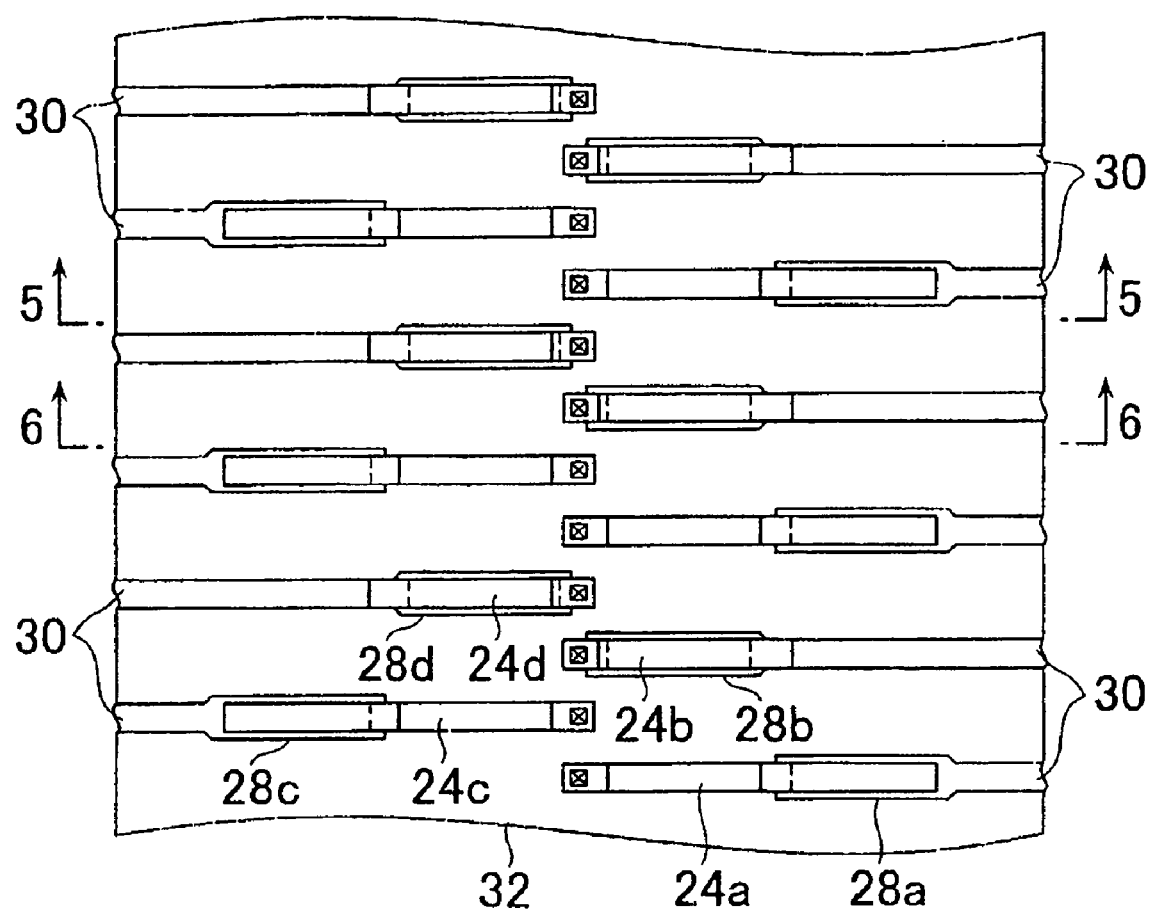
Figure No. 4

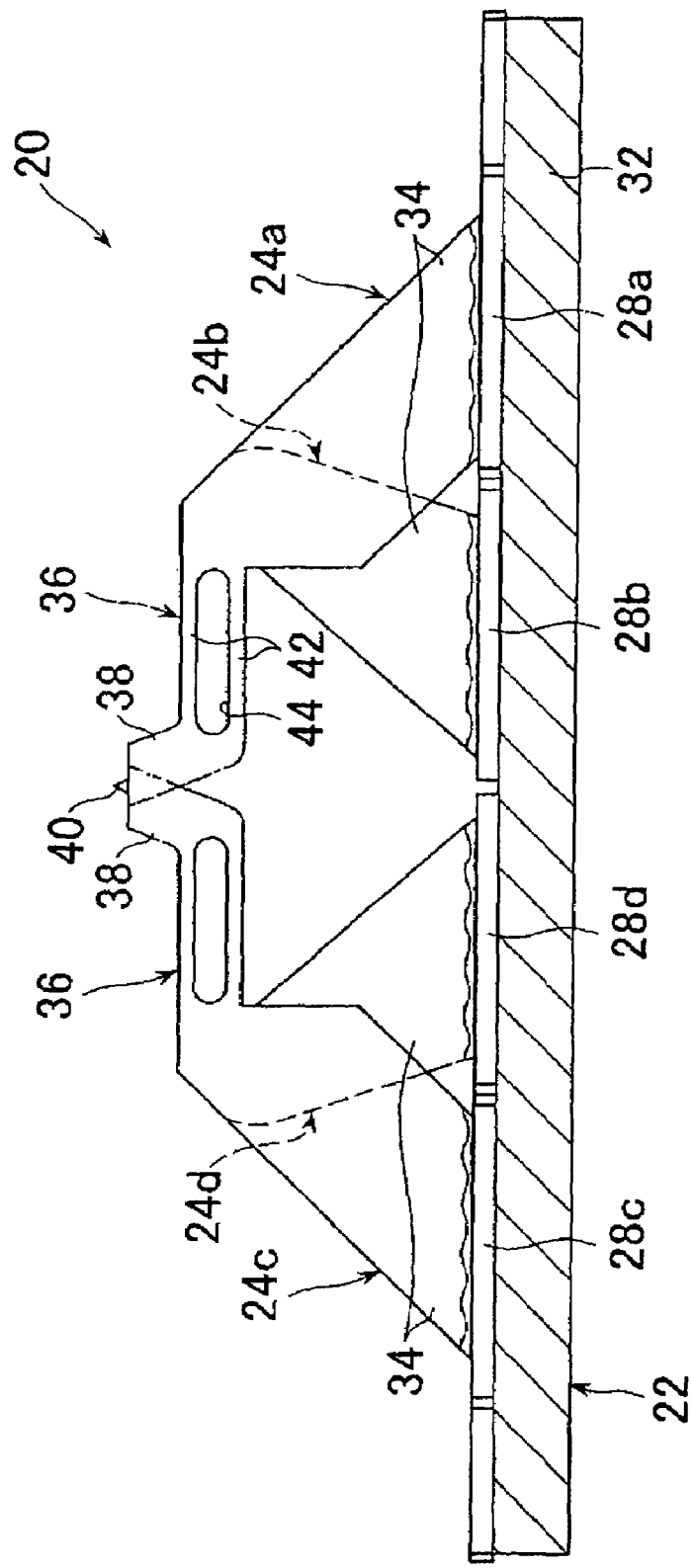
Figure No. 5

Figure No. 6
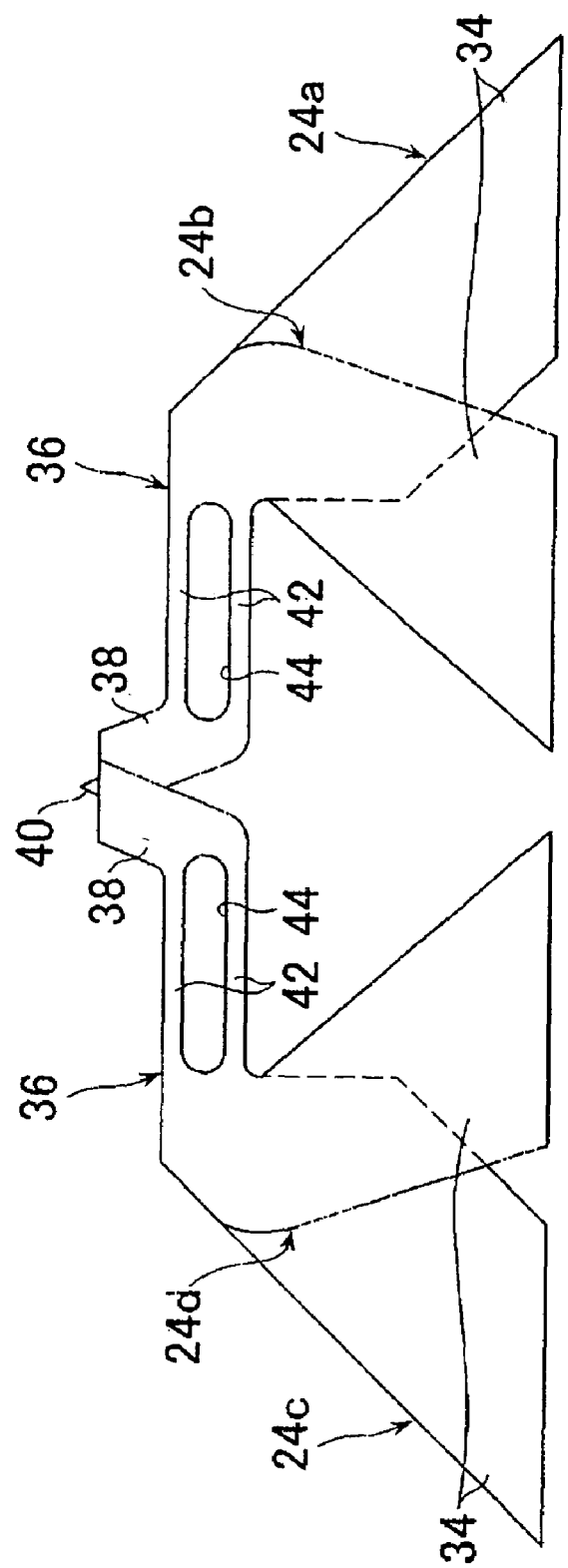

Figure No. 7
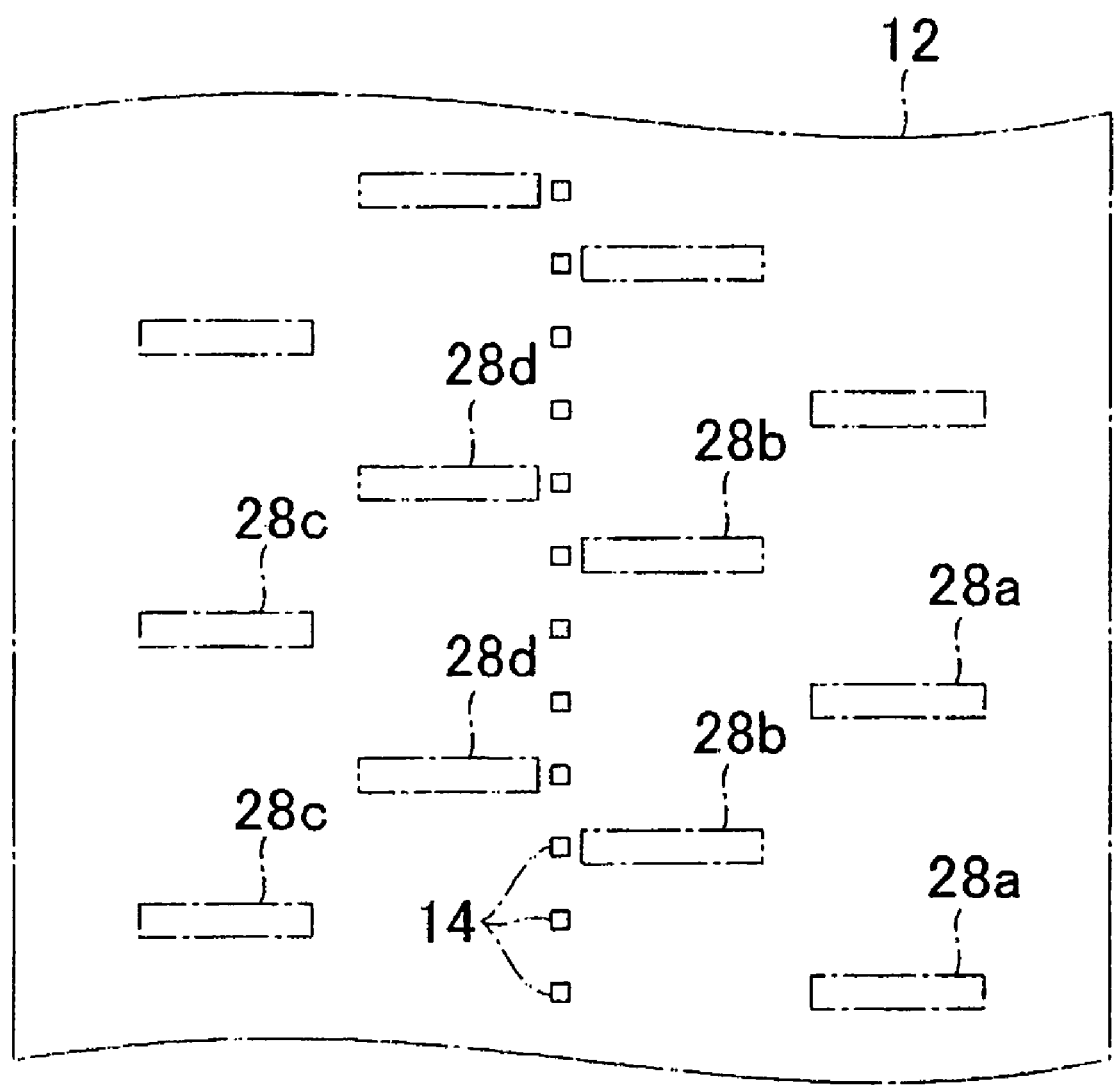

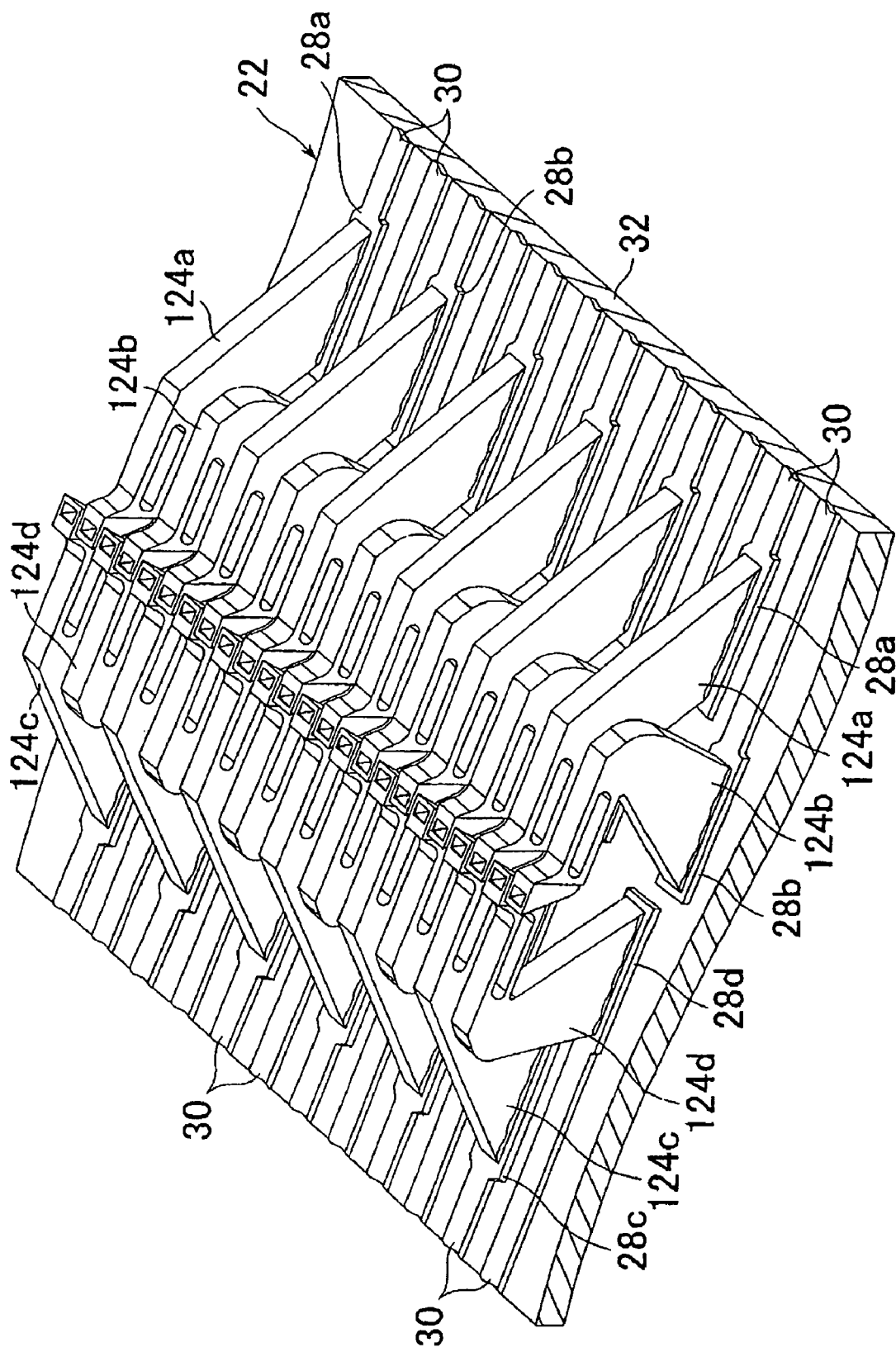
Figure No. 8

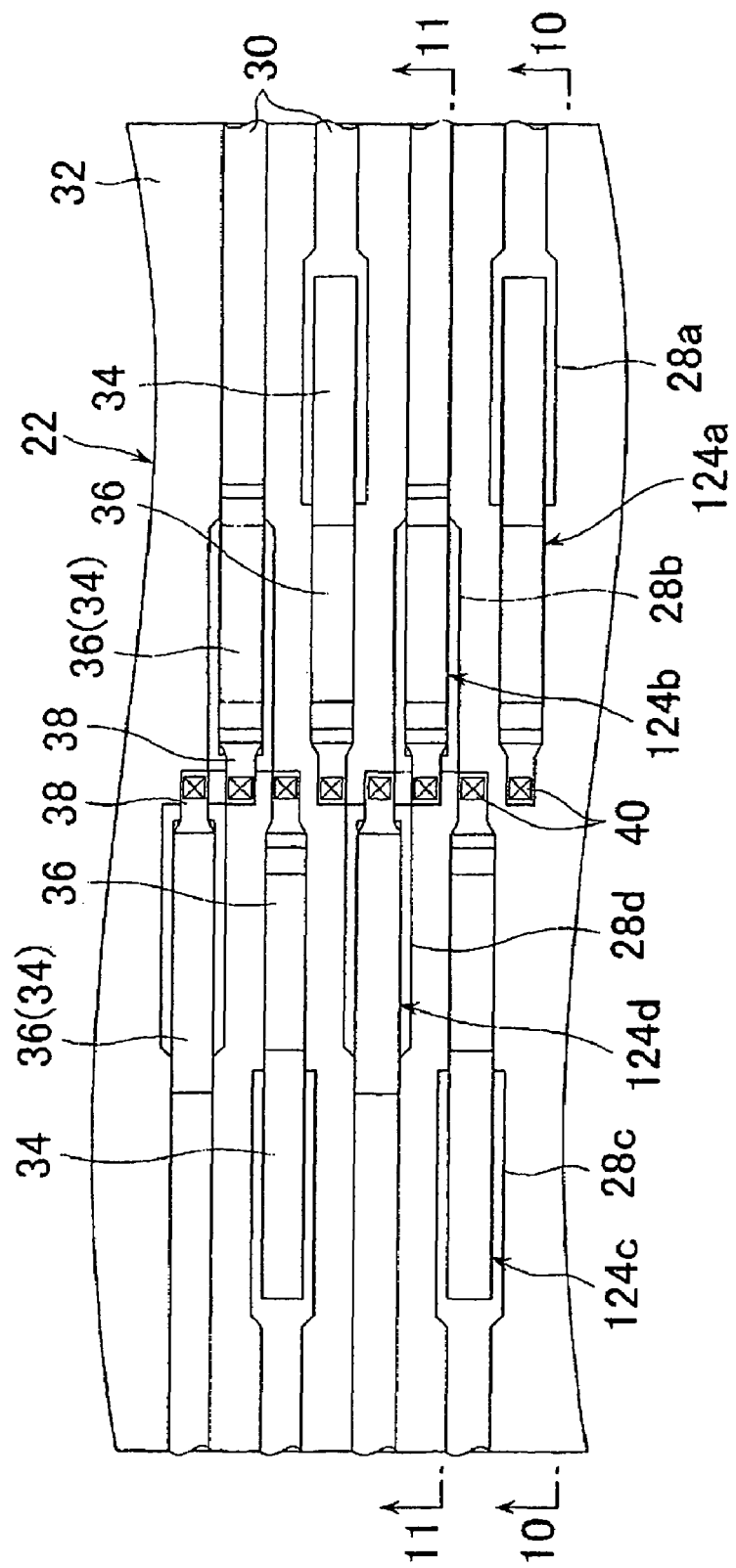
Figure No. 9

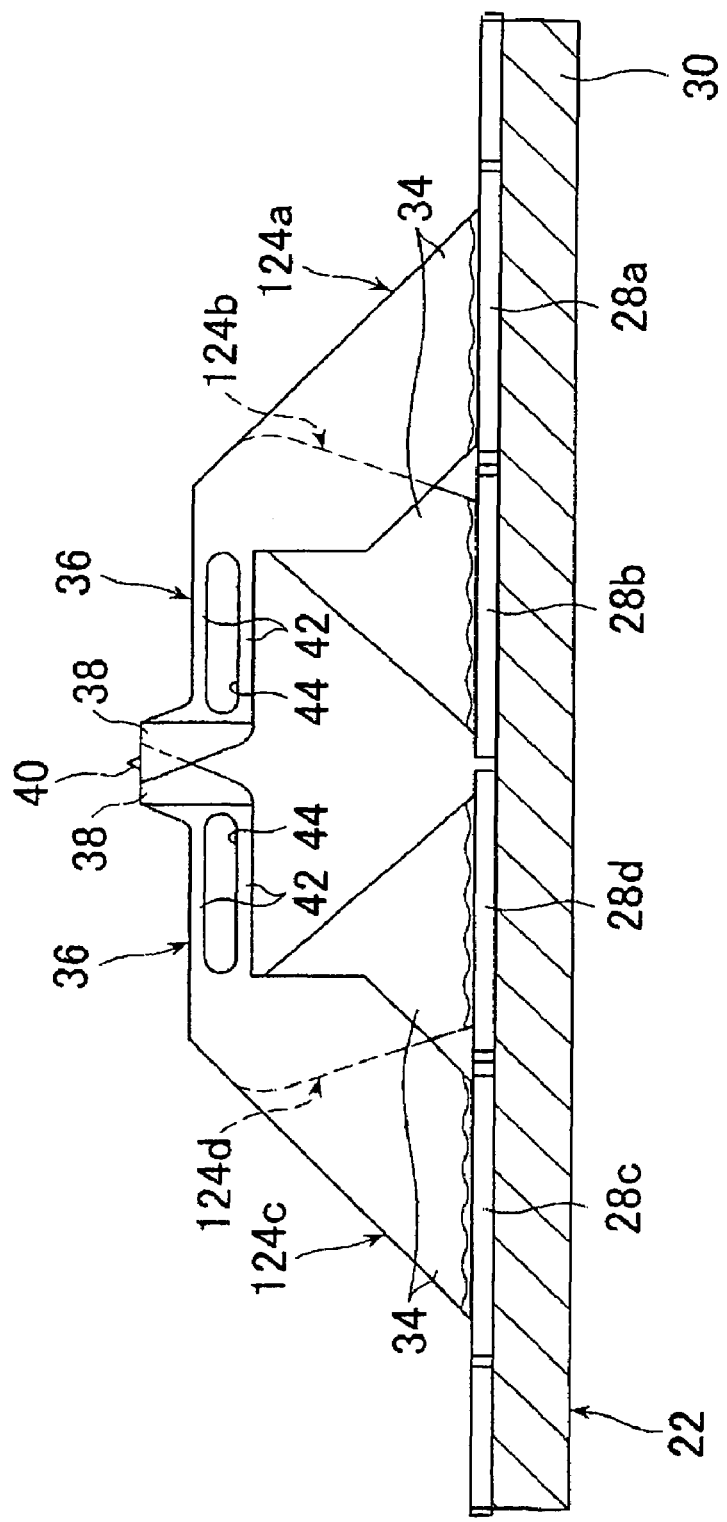
Figure No. 10

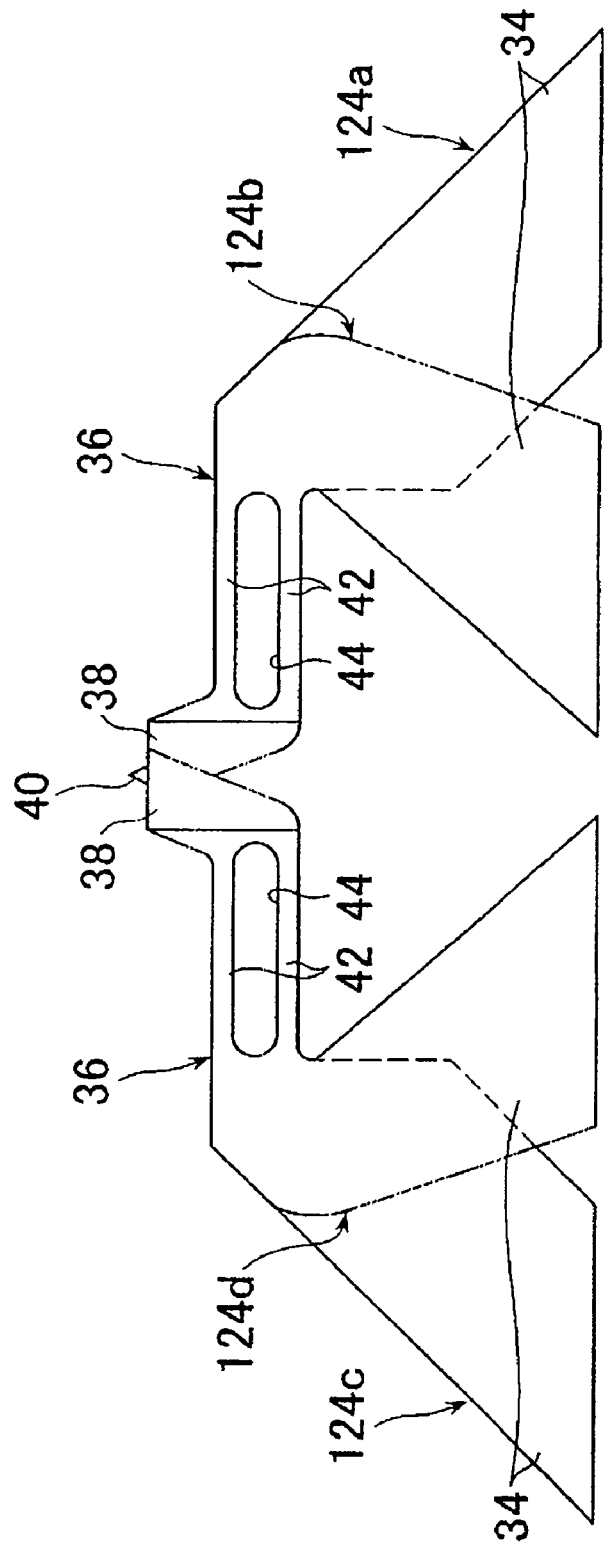
Figure No. 11

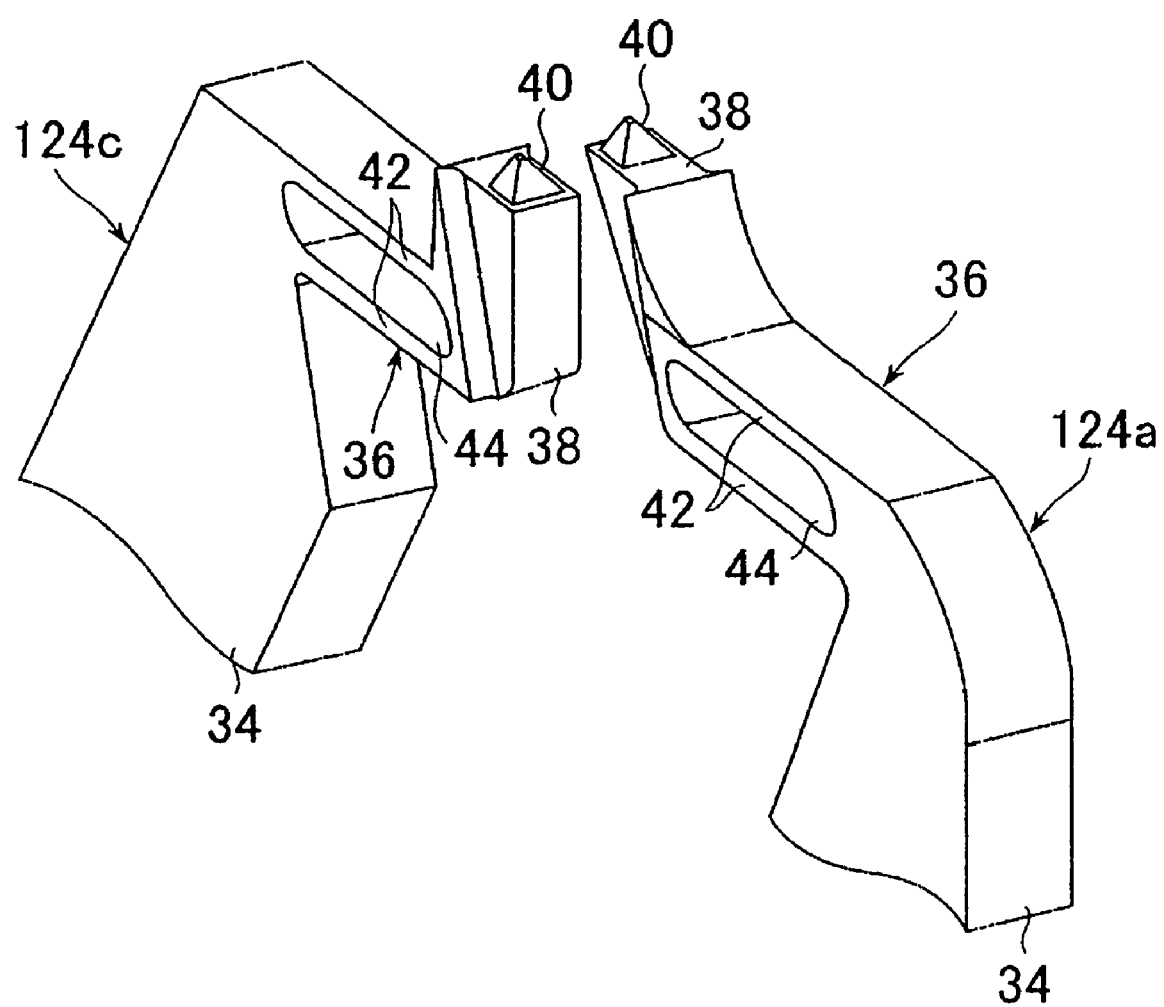
Figure No. 12

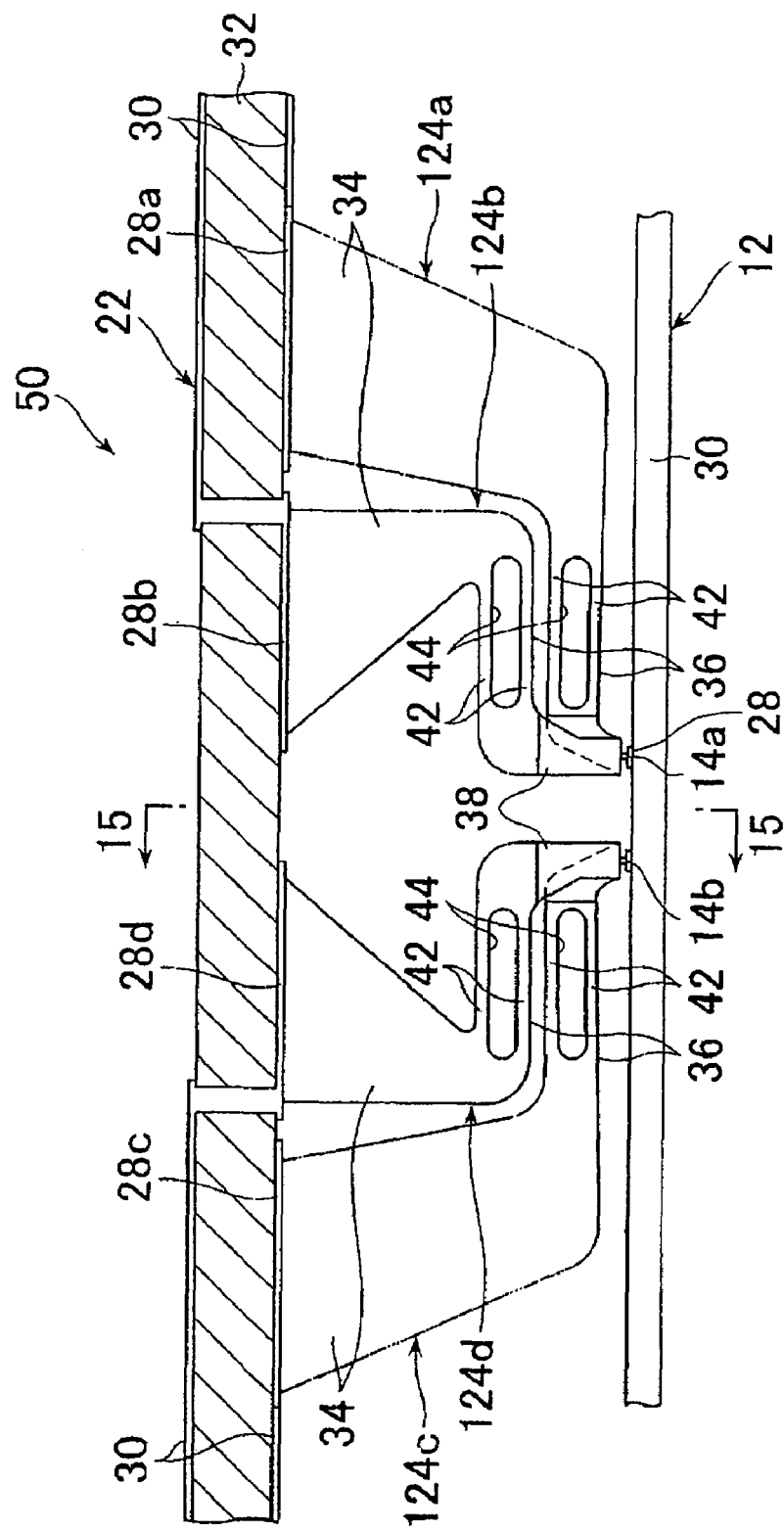
Figure No. 13

Figure No. 14
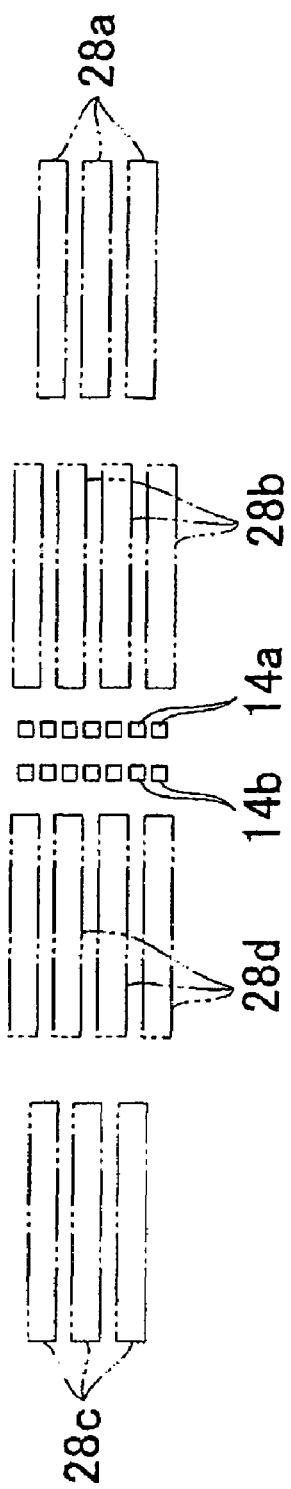

Figure No. 15
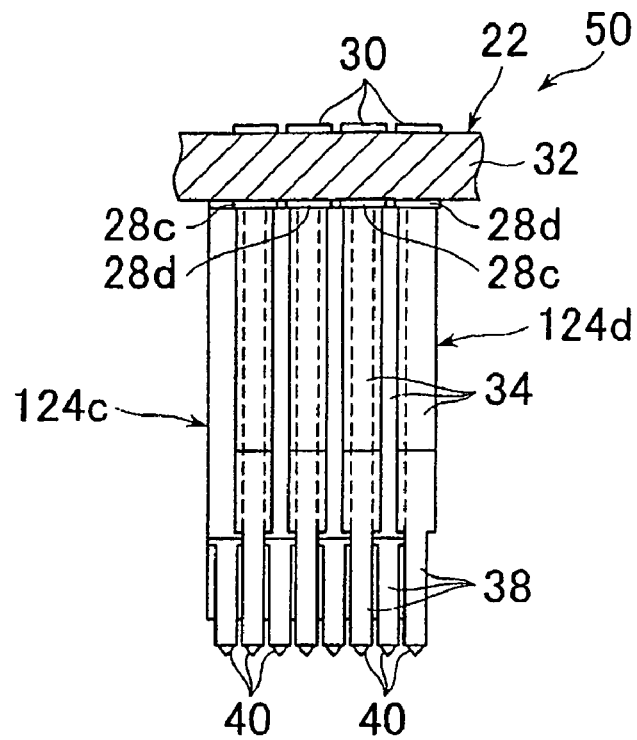
Figure No. 16
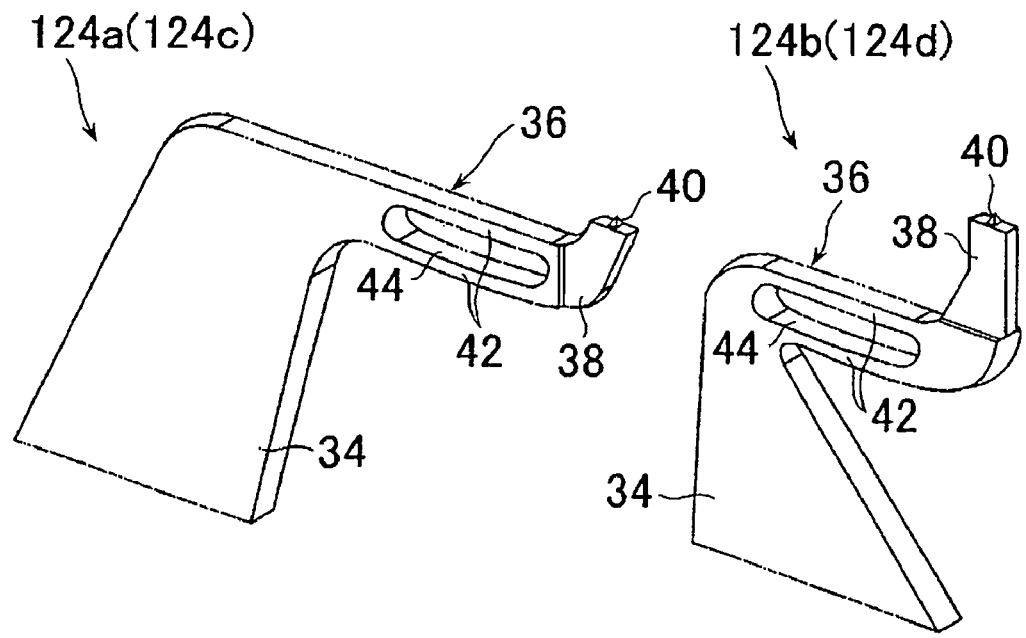

ELECTRICAL CONNECTING APPARATUS AND CONTACT

FIELD OF THE INVENTION

The present invention relates to an electrical connecting apparatus for use in an electrical test of a plate-like device under test such as a semiconductor integrated circuit.

BACKGROUND ART

A plate-like device under test such as a semiconductor integrated circuit is subjected to an electrical test as to whether or not it is produced as per specification. Such an electrical test is conducted, using an electrical connecting apparatus such as a probe card, a probe block, a probe unit, etc., which are provided with a plurality of probes, i.e., contacts to be individually pressed against electrodes of a device under test. This type of electrical connecting apparatus is utilized to electrically connect the electrodes of the device under test and a tester.

As kinds of such electric connecting apparatus, Patent Documents 1 and 2 describe those with probes, i.e., contacts mounted on a mounting portion of a base plate such as a wiring base plate, a probe sheet or the like in a cantilever state.

Patent Document 1: Japanese Patent Appln. Public Disclosure No. 2003-43064 Official Gazette Patent Document 2: Japanese Patent Appln. Public Disclosure No. 2003-57264 Official Gazette Both these conventional apparatus comprise at least one contact group with a plurality of contacts arranged in one row, each contact being adhered to a mounting portion such as the wiring and wiring land of a wiring base plate by means of a conductive adhesive such as solder. Since it is technically hard to adhere contacts to a mounting portion, adhesion is made per contact.

In both prior apparatus, however, since mounting positions of the contacts to the mounting portion are coincident in a direction orthogonal to the alignment direction of the contacts, when adhering the contacts by means of solder, adjoining mounting portions are damaged by the heat for soldering. As a result, an arrangement pitch for the contacts should be made large.

Also, when the contacts are mounted on the mounting portion by welding by using a laser beam, adjoining mounting portions are heated to be damaged, so that an arrangement pitch of the contacts should be made large.

DISCLOSURE OF THE INVENTION

Problems to Be Solved by the Invention:

An object of the present invention is to prevent any damage to adjoining mounting portions due to heat at the time of mounting contacts and to make an arrangement pitch of the contacts smaller.

Means to Solve Problems:

The electrical connecting apparatus according to the present invention comprises: a base plate including a first and a second mounting portion groups respectively having a plurality of first and second mounting portions arranged to be alternately positioned in a first direction; and a first and a second contact groups respectively having a plurality of first and second contacts mounted individually on the first and second mounting portions in a cantilever state, the mounting positions of the first and second contacts on the base plate being displaced from each other in a second direction intersecting the first direction.

If the first and second mounting portions are alternately positioned in the first direction and the mounting positions of the first and second contacts on the base plate are displaced from each other in the second direction, not only a distance between the center positions of the mounting positions of the first and second contacts adjoining in the first direction becomes large but also a distance between the center positions in the first direction of the mounting positions of the first contacts adjoining in the first direction becomes large.

As a result, even if the arrangement pitch of the contacts is reduced, the heat at the time of mounting the contacts is prevented from affecting the adjoining mounting portions, thereby preventing any damage to the adjoining mounting portions.

Each of first and second contacts may have a plate-like seat portion inclined toward one side or the other side in the second direction relative to the base plate and mounted on the mounting portion at one end so as to extend in the second direction. By this, even if respective contacts are mounted such that the tips (needle points) of the first and second contacts are positioned linearly, an electrical effective lengths of the first and second contacts can be made the same.

The base plate may further include a third and a fourth mounting portion groups respectively having a plurality of third and fourth mounting portions arranged to be alternately positioned in the first direction. The electrical connecting apparatus may further comprise a third and a fourth contact groups respectively having a plurality of third and fourth contacts mounted individually on the third and fourth mounting portions in a cantilever state; and mounting positions of the third and fourth contacts on the mounting portions may be displaced from each other in the second direction. By this, even if an arrangement pitch of the contacts is made smaller, the heat at the time of mounting the contacts is prevented from affecting the adjoining mounting portions, thereby preventing any damage to the adjoining mounting portions.

The third and fourth contacts may be respectively inclined toward the other side and one side in the second direction relative to the base plate. By this, even if each contact is mounted such that the tips (needle points) of the third and fourth contacts are positioned linearly, an electrical effective length of the third and fourth contacts can be made equal.

Each contact may be provided with an elastically deformable arm portion extending from the seat portion in the second direction, a needle point portion extending from the tip of the arm portion toward the side opposite to the base plate, and a projection projecting from the tip of the needle point portion toward the side opposite to the base plate. By this, when an over drive acts on the contacts, the contacts are elastically deformed in the arm portions, so that by making spring force of the arm portions equal, a so-called needle pressure acting on the electrode of the device under test and the tip of the contact become equal, thereby facilitating the production of the contacts.

The arm portion may have a slot penetrating the arm portion in the thickness direction of the seat portion and forming a pair of arms spaced apart in a direction intersecting the base plate. Thereby, since the rigidity of the arm portion becomes large, a great needle pressure can be obtained with a small over drive amount.

Each contact may be a plate-like blade needle. Also each mounting portion may have a strip-like shape elongated in the second direction, and the base plate may further include a plurality of wirings individually connected to the mounting portions. Further, the first and second mounting portions may be displaced from each other in the second direction.

The contacts according to the present invention is provided with a plate-like seat portion, an elastically deformable arm portion extending from the seat portion in the width direction of the seat portion, and a needle point portion extending from the tip of the arm portion toward the side opposite to the side of the seat portion. The thickness of the needle point portion is made smaller than the thickness of the seat portion and the arm portion.

As in case of the contact according to the present invention, if the thickness dimension of the needle point portion is smaller than that of the seat portion and arm portion, in a state of assembling as an electrical connecting apparatus using a plurality of such contacts, electrical interference between adjoining probes is reduced though an arrangement pitch of the contacts can be made small by arranging only the needle point portions in the aligning direction of the contacts.

The contact according to the present invention may be further provided with a projection projecting from the tip of the needle point portion toward the side opposing the side of the seat portion.

In the contact according to the present invention, the seat portion may be inclined in either one of the one side and the other side in the width direction of the seat portion relative to the arm portion. Thereby, the contacts can be mounted on the base place in the seat portion such that one and the other of two kinds of contacts are inclined respectively toward the one side and the other side in the second direction relative to the base plate of the electrical connecting apparatus, so that electrical effective lengths of the contacts can be made the same even if respective contacts are mounted on the base plate such that the tips (needle points) of the contacts are positioned linearly.

Another electrical connecting apparatus according to the present invention comprises a base plate provided with a plurality of first and second mounting portions arranged to be alternately positioned in the first direction, and, as mentioned above, a plurality of contacts having a smaller thickness dimension of the needle point portion than the thickness dimensions of the seat portion and the arm portion. The contacts are divided into at least a first and a second contacts mounted in the seat portion respectively on the first and second mounting portions in a cantilever state. The mounting position of the first and the second contacts on the base plate are displaced from each other in the second direction intersecting the first direction.

As in case of another electrical connecting apparatus according to the present invention, if the first and second mounting portions are alternately positioned in the first direction and the mounting positions of the first and second contacts on the base plate are displaced from each other in the second direction, not only the distance between the center positions in the second direction of the mounting positions of the first and second contacts adjoining in the first direction becomes large, but also the distance between the center positions in the first direction of the mounting positions of the first contacts adjoining in the first direction as well as the distance between the center positions in the first direction of the mounting positions of the second contacts adjoining in the first direction become large. As a result, even if the arrangement pitch of the contacts are made smaller, the heat at the time of mounting the contacts is prevented from affecting the adjoining mounting portions, thereby preventing any damage to the adjoining mounting portions.

In another electrical connecting apparatus according to the present invention, the base plate may be further provided with a plurality of third and fourth mounting portions arranged to be alternately positioned in the first direction and displaced in the second direction relative to the first and second mounting portions, and the contacts further include a plurality of third and fourth contacts mounted respectively on the third and fourth mounting portions in a cantilever state, and the mounting positions on the mounting portions of the third and fourth contacts may be displaced from each other in the second direction. By this, even if the arrangement pitch of the contacts are made smaller, the heat at the time of mounting the contacts is prevented from affecting the adjoining mounting portions, thereby preventing any damage to the adjoining mounting portions.

In another electrical connecting apparatus according to the present invention, the needle point portions of the first and second contacts may be aligned in the first direction.

In another electrical connecting apparatus according to the present invention, the needle point portions of the third and fourth contacts may be aligned in the first direction such that the needle point portions are spaced apart from the needle points of the first and second contacts in the second direction.

In another electrical connecting apparatus according to the present invention, however, the first, second, third and fourth contacts may have the needle point portions aligned in the first direction.

In the other electrical connecting apparatus according to the present invention, the length dimensions of the first and third contacts from the arm portion may be smaller than the length dimension of the needle point portion from the second and fourth contacts from arm portion.

BRIEF DESCRIPTION OF THE DRAWINGS

FIG. 1 is a bottom view showing one embodiment of the electrical connecting apparatus according to the present invention.

FIG. 2 is a front elevation of the electrical connecting apparatus shown in FIG. 1.

FIG. 3 is an enlarged perspective view of part of the electrical connecting apparatus shown in FIG. 1.

FIG. 4 is an enlarged bottom view of part of the electrical connecting apparatus shown in FIG. 1.

FIG. 5 is a section obtained along the line 5-5 in FIG. 4.

FIG. 6 is a section obtained along the line 6-6 in FIG. 4 in which the probe base plate is omitted.

FIG. 7 is an enlarged plan view of part of a device under test.

FIG. 8 is an enlarged perspective view of part of another electrical connecting device according to the present invention.

FIG. 9 is an enlarged bottom view of part of the electrical connecting device shown in FIG. 8.

FIG. 10 is a section obtained along the line 10-10 in FIG. 9.

FIG. 11 is a section obtained along the line 11-11 in FIG. 9 in which the probe base plate is omitted.

FIG. 12 is a perspective view showing one embodiment of the neighborhood of the needle point portion of the contact according to the present invention.

FIG. 13 is a perspective view showing another embodiment of another electrical connecting apparatus according to the present invention.

FIG. 14 is an enlarged plan view of part of a device under test to be inspected by the electrical connecting apparatus shown in FIG. 13.

FIG. 15 is a section obtained along the line 15-15 in FIG. 13.

FIG. 16 is a perspective view showing another embodiment of the contact according to the present invention.

THE BEST MODE FOR WORKING THE INVENTION

Referring to FIGS. 1 through 7, the electrical connecting apparatus 10 is constituted such that a semiconductor wafer shown in FIG. 7 having a plurality of uncut integrated circuit regions (tested regions) in a matrix state is used as a device under test 12, and that electrical tests of such plural integrated circuit regions, i.e., tested regions can be conducted simultaneously. Each tested region has a plurality of pad electrodes 14 in a row. The pad electrodes adjoining in a vertical direction are aligned in one row.

The electrical connecting apparatus 10 comprises a circular wiring base plate 20, a rectangular probe base plate 22 disposed in one of the faces of the wiring base plate 20, and a plurality of contacts 24 disposed on the face of the probe base plate 22 of the side opposite to the wiring base plate 20.

The wiring base plate 20 has in the periphery of its upper face a plurality of tester lands 26 to be connected to an electric circuit of a tester, and a plurality of wirings (not shown) electrically connected individually to the tester lands 26 on one face or inside.

As shown in FIGS. 3 through 6, the probe base plate 22 has a plurality of mounting portions 28 respectively having conductivity and a plurality of wirings 30 formed on one of the faces of an electrically insulating plate 32.

In the illustration, the mounting portions 28 are wiring lands individually connected to the wirings 30, but may be a part of the wirings 30. Each wiring 30 is electrically connected to the wiring (not shown) of the wiring base plate 20.

The wiring base plate 20 and the probe base plate 22 are relatively positioned by a plurality of positioning pins (not shown) penetrating these base plates in the thickness direction, and are connected to each other by a plurality of screw members (now shown).

The mounting portion 28 is assigned to every tested region to be simultaneously inspected. The plural mounting portions 28 assigned to the respective tested regions are divided into a first, a second, a third and a fourth mounting portion groups, each including a plurality of mounting portions 28.

The mounting portions 28 assigned to the first, second, third and fourth mounting portion groups respectively act as a first, a second, a third and a fourth mounting portions. In FIGS. 3 through 7, the first, second, third and fourth mounting portions are shown by reference numerals 28a, 28b, 28c and 28d, respectively.

The first and second mounting portions 28a and 28b are spaced apart in the first direction and displaced from each other in the second direction orthogonal to the first direction, further extending in the second direction.

The third and fourth mounting portions 28c and 28d are displaced in the second direction relative to the first and second mounting portions 28a and 28b. The third and fourth mounting portions 28c and 28d are spaced apart from each other in the first direction and displaced from each other in the second direction to further extend in the second direction.

The contacts 24 are also assigned like the mounting portions 28 to the respective tested regions to be inspected simultaneously. The plural contacts 24 assigned to the respective tested regions are divided into a first, a second, a third and a fourth contact groups, each containing the plural contacts 24.

The contacts 24 assigned to the first, second, third and fourth contact groups respectively act as a first, a second, a third and a fourth contacts. In FIGS. 3 through 6, the first, second, third and fourth contacts are shown by reference numerals 24a, 24b, 24c and 24d.

First and second contacts 24a and 24b are spaced apart from each other in the first direction and displaced from each other in the second direction.

Third and fourth contacts 24c and 24d are displaced in the second direction relative to the first and second contacts 24a and 24b. The third and fourth contacts 24c and 24d are spaced apart from each other in the first direction and displaced from each other in the second direction.

Since the contacts 24 and mounting portions 28 corresponding to the respective tested regions are divided into four groups as mentioned above, the wirings 30 corresponding to the respective tested regions are also divided into four groups.

Each contact 24 is a plate-like blade needle, as shown in FIGS. 5 and 6, provided with a plate-like seat portion 34, an arm portion 36 extending from the seat portion 34 in the second direction, a needle point portion 38 extending from the tip of the arm portion 36 toward the side opposite to the probe base plate 22, and a projection 40 projecting from the tip of the needle point portion 38 toward the side opposite to the probe base plate 22.

Each contact 24 is mounted on the base plate 20 such that the thickness direction becomes the arrangement direction (the first direction) of the contacts 24.

The contacts 24 made to correspond to the respective tested regions are mounted on the mounting portion 28 in the seat portion 34 so that their projections 40 may be positioned in series, repeating the order of the first, second, third and fourth contacts 24a, 24b, 24c and 24d. The electrical effective lengths from the tips of the projections 40 of the contacts 24 to the mounting portions 28 are made equal.

Consequently, the seat portions 34 of the first and third contacts 24a and 24c are inclined toward one side in the second direction, and the seat portions 34 of the second and fourth contacts 24b and 24d are inclined toward the other side in the second direction.

Each arm portion 36 has a slot 44 penetrating the seat portion 34 in its thickness direction and forming a pair of arms 42 spaced apart in the direction orthogonal to the probe base plate 22, and is made elastically deformable.

The electrical connecting apparatus 10 is attached to the tester such that the vertical direction is inverted from that of the illustration. In the state of being attached to the tester, the electrical connecting apparatus 10 has the projection 40 of each contact 24 pressed against the pad electrode 14 of the device under test 12.

By this, an over drive acts on each contact 24, which is to be elastically deformed in the arm portion. In this state, a predetermined contact 24 is electrified from the tester, through the tester land 26, the wiring of the wiring base plate 20 and the wiring 30 of the probe base plate 22, and an electrical signal is returned from a certain contact 24 to the tester.

In the electrical connecting apparatus 10, the distance between the center positions in the second direction of the mounting positions of the first and second contacts 28a and 28b adjacent in the first direction and the distance between the center positions in the second direction of the mounting positions of the third and fourth contacts 28c and 28d adjacent in the first direction become great.

Also, the distance between the center positions in the first direction of the mounting positions of the first contacts 24a adjacent to each other in the first direction as well as the distance between the center positions in the first direction of the mounting positions of the third contacts 24c adjacent to each other in the first direction becomes great.

As a result, even if the arrangement pitch of the contacts 24 are made small, the heat at the time of mounting the contacts 24 is prevented from affecting the adjacent mounting portions 28, thereby preventing any damage to the adjacent mounting portions 28. Also, since the seat portions and the arm portions of the adjacent contacts do not oppose, electrical interference between the adjoining contacts is prevented or reduced.

In place of making the thickness dimension of the needle point portion 28 (the dimension in the arranging direction of the contacts) equal to that of the seat portion 34 and the arm portion 36, as in case of the above-mentioned contacts 24, the thickness dimension of the needle point portion 38 may be made smaller than that of the seat portion 34 and the arm portion 36, like contacts 124 as shown in FIGS. 8 through 12.

In the contact 124 shown in FIGS. 8 through 12, not only the thickness dimension of the needle point portion 38 but also the maximum dimension of each projection 40 in the arranging direction of the contacts 124 is made smaller than that of the seat portion 34 and the arm portion 36. In case of the contacts 124 also, a first, a second, a third and a fourth contacts are shown by reference numerals 124a, 124b, 124c and 124d, respectively.

The first, second, third and fourth contacts 124a, 124b, 124c and 124d are respectively made to correspond to the first, second, third and fourth contacts 24a, 24b, 24c and 24d in the embodiments shown in FIGS. 1 through 7, and assembled into the electrical connecting apparatus 10 like the corresponding contacts, except that the thickness dimension of the needle point portion 38 and the maximum dimension of the projection 40 are as mentioned above.

According to the contacts 124 and the electrical connecting apparatus 10 using them, since the thickness dimension of the needle point portion 38 of each contact 124 is smaller than that of the arm portion 36, the arrangement pitch of the contacts 124 can be made smaller by aligning only the needle point portions 38 in the arranging direction of the contacts 124.

As a result, even if the arrangement pitch of the contacts 124 is made smaller, the heat at the time of mounting the contacts 124 is prevented from affecting the adjacent mounting portions 28, thereby preventing any damage to the adjacent mounting portions 28. Also, since the seat portions 34 of the adjoining contacts do not oppose each other, electric interference between the adjoining contacts 124 is prevented or reduced.

The present invention can be applied not only to an electrical connecting apparatus for a device under test having a plurality of electrodes in one row in tested regions but also to an electrical connecting apparatus for a device under test having a plurality of electrodes in a plurality of rows in tested regions. In the latter case, it suffices to provide a plurality of contact groups for each row of electrodes.

Referring to FIGS. 13 through 16, the electrical connecting apparatus 50 is, as shown in FIG. 14, used for electrical test of the device under test 12 having a plurality of electrodes 14a, 14b in a plurality of rows in the tested region.

In view of the above, in the electrical connecting apparatus 50, the first and second contacts 124a, 124b, and the third and fourth contacts 124c, 124d are respectively made to correspond to one and the other of the electrodes 14a and 14b, and the first and second contacts 124a, 124b, and the third and fourth contacts 124c, 124d are spaced apart in the second direction.

Also, in the electrical connecting apparatus 50, in order to make the arm portion 36 of the second and fourth contacts 124b and 124d positioned nearer the side of the probe base plate 22 than the arm portion 36 of the first and third contacts 124a and 124c is, the length dimension of the needle point portion 38 from the arm portion 36 of the first and third contacts 124a and 124c is made smaller than the length dimension of the needle point portion 38 from the arm portion 36 of the second and fourth contacts 124b and 124d.

Furthermore, in the electrical connecting apparatus 50, the wirings 30 for the second and third contacts 128b, 128c penetrate the electrical insulating plate 32 of the probe base plate 22 to extend on the backside in the second direction.

In the electrical connecting apparatus 50, since both the seat portion 34 and the arm portion 36 of the adjoining contacts 124 do not oppose each other, even by making the arrangement pitch of the contacts 124 smaller, electrical interference between the adjoining contacts 24 can be more surely prevented or reduced.

In the electrical connecting apparatus 50, the contacts 24 in the embodiments as shown in FIGS. 1 through 7 may be employed in place of the contacts 124.

INDUSTRIAL APPLICABILITY

The present invention is not limited to the above embodiments and can be variously modified without departing from its purport.

What is claimed is:

1. An electrical connecting apparatus comprising: a base plate with a first mounting portion group and a second mounting portion group respectively having a plurality of first mounting portions and a plurality of second mounting portions arranged to be alternately positioned in a first direction;

a first contact group and a second contact group respectively having a plurality of first contacts and a plurality of second contacts individually mounted on said first mounting portions and said second mounting portions in a cantilever state;

wherein each of said first and second contacts has a seat portion attached to said mounting portion and extending in a third direction intersecting both of said first direction and a second direction intersecting said first direction, an elastically deformable arm portion extending from said seat portion in a second direction, a tip portion extending from the front end portion of said arm portion toward the opposite side of said base plate, and a projected portion projecting from the front end of said tip portion toward the opposite end of said seat portion side;

wherein attached positions of said first and second contacts on said mounting portions are displaced from each other in said second direction; and wherein the seat portions of said first and second contacts are respectively inclined toward the other side and the one side in said second direction relative to said base plate such that their tip portions are positioned on an imaginary straight line extending in parallel to said first direction.

2. An electrical connecting apparatus as claimed in claim 1, wherein each contact is a plate-like blade needle.

3. An electrical connecting apparatus as claimed in claim 1, wherein each mounting portion has a strip-like shape elongated in the second direction, and
wherein said base plate is further provided with a plurality of wirings individually connected to said mounting portions.

4. An electrical connecting apparatus as claimed in claim 1, wherein said first and second mounting portions are displaced from each other in the second direction.

5. An electrical connecting apparatus as claimed in claim 1, wherein said tip portion has a smaller thickness dimension than that of said seat portion and seat arm portion.

6. An electrical connecting apparatus as claimed in claim 1, wherein said seat portion is inclined toward either the one side or the other side in the width direction of said seat portion relative to said arm portion.

7. An electrical connecting apparatus as claimed in claim 1, wherein said base plate further includes third and fourth mounting portion groups respectively having a plurality of third mounting portions and a plurality of fourth mounting portions arranged to be alternately positioned in the first direction;

wherein said electrical connecting apparatus further comprises third and fourth contact groups having respectively a plurality of third contacts and a plurality of fourth contacts mounted individually on said third and fourth mounting portions in a cantilever state;

wherein each of said third and fourth contacts has a seat portion attached to said mounting portion and extending in said third direction, an elastically deformable arm portion extending from said seat portion in said second direction, a tip portion extending from the front end portion of said arm portion toward the opposite side of said base plate, and a projected portion projecting from the front end of said tip portion toward the opposite side of said seat portion side;

wherein attached portions of said third and fourth contacts on said mounting portions are displaced from each other in said second direction; and wherein the seat portions of said third and fourth contacts are respectively inclined toward the other side and the one side in said second direction relative to said base plate such that their tip portions are positioned on an imaginary line extending in parallel to said first direction.

8. An electrical connecting apparatus as claimed in claim 7, wherein said arm portion has a slot penetrating said arm portion in the thickness direction of said seat portion and forming a pair of arms spaced apart in a direction intersecting said base plate.

* * * * *

UNITED STATES PATENT AND TRADEMARK OFFICE
CERTIFICATE OF CORRECTION

| | |
|---|---|
| PATENT NO. | : 7,377,788 B2 |
| APPLICATION NO. | : 11/485518 |
| DATED | : May 27, 2008 |
| INVENTOR(S) | : Yoshiei Hasegawa |

Page 1 of 1

It is certified that error appears in the above-identified patent and that said Letters Patent is hereby corrected as shown below:

On the Title Page, please add the following:
  "Section (30) Foreign Application Priority Data
    Jan. 16, 2004   (JP) .... 2004-9210
    Jan. 19, 2004   (JP) .... 2004-10324
    Oct. 26, 2004   (WO) ... PCT/JP04/16206"

Signed and Sealed this

Twenty-fourth Day of February, 2009

JOHN DOLL
*Acting Director of the United States Patent and Trademark Office*